US012733179B2

(12) United States Patent
Blair et al.

(10) Patent No.: US 12,733,179 B2
(45) Date of Patent: Sep. 8, 2026

(54) PROGRAMMABLE HYBRID MEMORY AND CAPACITIVE DEVICE IN A DRAM PROCESS

(71) Applicant: XILINX, INC., San Jose, CA (US)

(72) Inventors: Zachary Blair, San Jose, CA (US); Gabriel Loh, Bellevue, WA (US); Paul Hartke, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 697 days.

(21) Appl. No.: 18/090,216

(22) Filed: Dec. 28, 2022

(65) Prior Publication Data

US 2024/0224542 A1 Jul. 4, 2024

(51) Int. Cl.

*H01L 23/522* (2006.01)
*H01L 23/528* (2006.01)
*H10B 80/00* (2023.01)
*H10W 20/40* (2026.01)
*H10W 20/41* (2026.01)

(52) U.S. Cl.

CPC .......... *H10B 80/00* (2023.02); *H10W 20/427* (2026.01); *H10W 20/496* (2026.01)

(58) Field of Classification Search

CPC ............. H01L 25/0657; H01L 23/5286; H01L 2924/1436; H10B 12/30

See application file for complete search history.

(56) References Cited

U.S. PATENT DOCUMENTS 5,790,839 A * 8/1998 Luk ........................ G11C 5/025 713/300
2004/0157163 A1* 8/2004 Chen .................. H10B 12/0387 430/311
2009/0040857 A1* 2/2009 McNeil ................... H01L 22/22 365/226
2012/0250443 A1* 10/2012 Saraswat ............. H01L 23/5286 365/226
2014/0016389 A1 1/2014 Liu et al.
2018/0096735 A1 4/2018 Pappu
2020/0356488 A1* 11/2020 Malladi ................. G11C 11/417
2021/0366532 A1 11/2021 Ning
2023/0260968 A1* 8/2023 Devaux ................... H01L 25/18 257/774

OTHER PUBLICATIONS

International Search Report and Written Opinion from PCT/US2023/034402 dated Feb. 19, 2024.

* cited by examiner

*Primary Examiner* — Kretelia Graham
*Assistant Examiner* — David J Goodwin
(74) *Attorney, Agent, or Firm* — Patterson + Sheridan, LLP

(57) ABSTRACT

A DRAM fabrication process for producing a semiconductor die adapted for having the ability to be both a hybrid memory and power supply capacitance. DRAM arrays on a semiconductor die may be individually selected to function as either a memory or as supplemental capacitance on a power distribution network serving circuits on one or more semiconductor dice in a three-dimensional active-on-active (AoA) stacked semiconductor die package configuration. Defective DRAM array trench capacitors can be repurposed to serve as supplemental capacitance on a power distribution network. DRAM array trench capacitors can be dynamically reassigned as supplemental capacitance when power supply monitors sense that additional power supply capacitance is needed.

17 Claims, 5 Drawing Sheets

PROGRAMMABLE HYBRID MEMORY AND CAPACITIVE DEVICE IN A DRAM PROCESS

TECHNICAL FIELD

Embodiments of the present invention generally relate to integrated circuit devices having active-on-active (AoA) stacked semiconductor dice, and in particular, to an AoA stack having dynamic random memory access (DRAM) cells to provide a combination of both memory and power network capacitance.

BACKGROUND

Electronic products, such as tablets, computers, copiers, digital cameras, smart phones, control systems and automated teller machines, among others, often employ electronic components which leverage chip package assemblies for increased functionality and higher component density. Conventional chip packaging schemes often utilize a plurality of integrated circuit (IC) dies to be mounted to a single package substrate. The IC dies may include memory, logic, processor or other IC devices.

Planar programmable device architectures have been steadily increasing in power density as manufacturing nodes shrink the feature size of compute logic. This has motivated innovation in power delivery network (PDN) technology, including advancements in package, interposer, and silicon for regulating power and reducing electrical noise. To manage electrical noise and voltage droop caused by transient power consumption, capacitance is added at each power distribution level of the system and device—discrete capacitors between the board voltage regulation module (VRM) and package (encloses or encapsulates an IC device), more capacitors either on the package next to the IC device or embedded in the package in the IC device shadow, trench capacitors embedded in a chip-on-wafer-on-substrate (CoWoS) interposer, metal-insulator-metal capacitors (MIMCAPs) embedded in upper metal layers of the silicon die, and metal oxide semiconductor capacitors (MOSCAPs) constructed from transistors on the silicon itself. There are performance, cost, and form factor tradeoffs to the various capacitance solutions, and power integrity can be a high priority for achieving an efficient compute architecture.

With the realization of three-dimensional (3D) IC devices, there is a dramatic jump in compute and power density that is not matched by the ability to deliver power or off-chip memory access, both of which are limited by the planar surface area of package pins for power and input-output (I/O) at the base of a semiconductor dice stack. High-speed memory access (e.g., high bandwidth memory (HBM) DRAM) is further limited by the linear edge of a device. Neither the edge nor surface of a planar IC device scales when stacking devices, which creates a disparity between the ratios of complementary metal oxide semiconductor (CMOS) logic to I/O relative to planar devices. Moreover, compute logic is nearly guaranteed to be thermally limited and/or have power integrity issues because of the higher logic density. In this context, there is an opportunity to rearchitect devices to balance tradeoffs in memory hierarchy and power delivery in ways that were previously untenable due to the opportunity cost of required silicon.

In an architecture where compute density is maximized within a thermal envelope, without full utilization of the 3D silicon area, power efficiency can be improved by minimizing the cost of data movement through expanded memory hierarchy, increasing locality of data to compute. For example, the relative cost of an access to 3D-connected Level 2 cache memory (L2 SRAMs) is an order of magnitude lower than off-chip HBM, which shifts power consumption from data movement and I/O to further increasing maximum compute capacity. Further, there is greater than an order of magnitude more bandwidth between layers (to 3D-connected SRAM) than to off-chip HBM. While it is an improvement over planar devices, there are drawbacks to this technique. SRAM consumes more static power than DRAM, has ~10× lower density, and is manufactured in a standard CMOS process with little opportunity to improve the power integrity through added capacitance.

To improve power integrity, an alternative process can be used to manufacture a layer of trench capacitors with ~50-100× higher density than MOSCAPs made in a standard CMOS process. While this process may be inexpensive compared to a logic layer, it is unlikely to be compatible with any other useful resources, i.e., the entire layer must be dedicated to capacitance only. There are diminishing returns to adding capacitance, and significantly less than a full layer area of capacitance is required to mitigate power supply voltage droop.

Thus, there is a need for both improved power delivery in an AoA stack and more efficient utilization of IC die area of devices in the AoA stack.

SUMMARY

Using a full layer of a semiconductor die for capacitance has a lost opportunity cost in logic area, and an ideal solution would be to use a small portion of one die for dense capacitance and the remainder for logic or memory. Active-on-active/3D integration is an emerging technology in the semiconductor industry which allows dense interconnect on a planar surface between multiple layers of silicon devices. Adding a third dimension to a device design fundamentally changes the impact of architectural tradeoffs and allows reevaluation of memory hierarchy and power delivery methods. Embodiments disclosed herein describe construction of a 3D device in which one or more layers are manufactured using a DRAM process, those layers consisting of a plurality of trench capacitors used for both memory cells and enhancements to a power delivery network (PDN) thereof. In one embodiment, trench capacitors in one layer of silicon may be used as capacitors in the PDN for CMOS logic in the adjoined layers. In one embodiment, a method of enabling programmable allocation of trench capacitors as either power capacitors or for use in memory cells in at least one semiconductor die. In one embodiment, a method of silicon recovery in which defective memory elements are identified and dynamically reassigned as capacitors. With one or more silicon layers manufactured in a DRAM process, a hybrid memory and power capacitor plane(s) may serve to improve both the memory hierarchy and power integrity characteristics of the CMOS logic layers in an AoA 3D device.

An advantage in using a DRAM process for producing a semiconductor die adapted for being both a hybrid memory and capacitance in power distribution is that an optimal balance of area can be dedicated to an expanded memory hierarchy, and transient power effects can be explored and compensated for to maximize the compute and power efficiency of a device. DRAM cells use small trench capacitors for storing data, rather than power, but a fraction of these memory storage capacitors may be repurposed for distributed power capacitance throughout a device while still providing much higher memory density than, and equivalent bandwidth to, SRAMs in a CMOS logic die.

Defect tolerance is another consideration for device architectures which becomes more pronounced for AoA products, as Wafer-on-Wafer (WoW) hybrid bonding increases the physical dimensions of silicon by a factor equal to the number of layers, and reduces the probability of a defect-free device. Typical strategies for defect tolerance are the inclusion of fine or coarse-grained redundancy. For example, a fine-grained redundancy mechanism for DRAM may include additional columns in each bank and a mechanism to disable a column with defective cells by shifting the output to select only from cells that are known to be functional. Similarly, coarse-grained redundancy mechanisms may include an entire redundant bank which can be configured to transparently replace another entire bank which did not yield.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the present disclosure generally relate to dedicating at least one layer of silicon in an AoA stack to a plurality of trench capacitors that may be adapted for use as both DRAM memory storage and power network capacitance. The result is a compute device with improved power efficiency, both in terms of reducing off-chip data movement and reduced droop voltage. Beyond the core concept of a hybrid memory and capacitance layer, it is contemplated and within the scope of this disclosure to add programmability for dynamically selecting which trench capacitors or banks of trench capacitors are connected to power and which are available for use as memory. Programmability may be used for tuning (adapting) the power and memory characteristics to a specific application, or as a mechanism for defect tolerance and silicon recovery (reuse).

Figure 1:
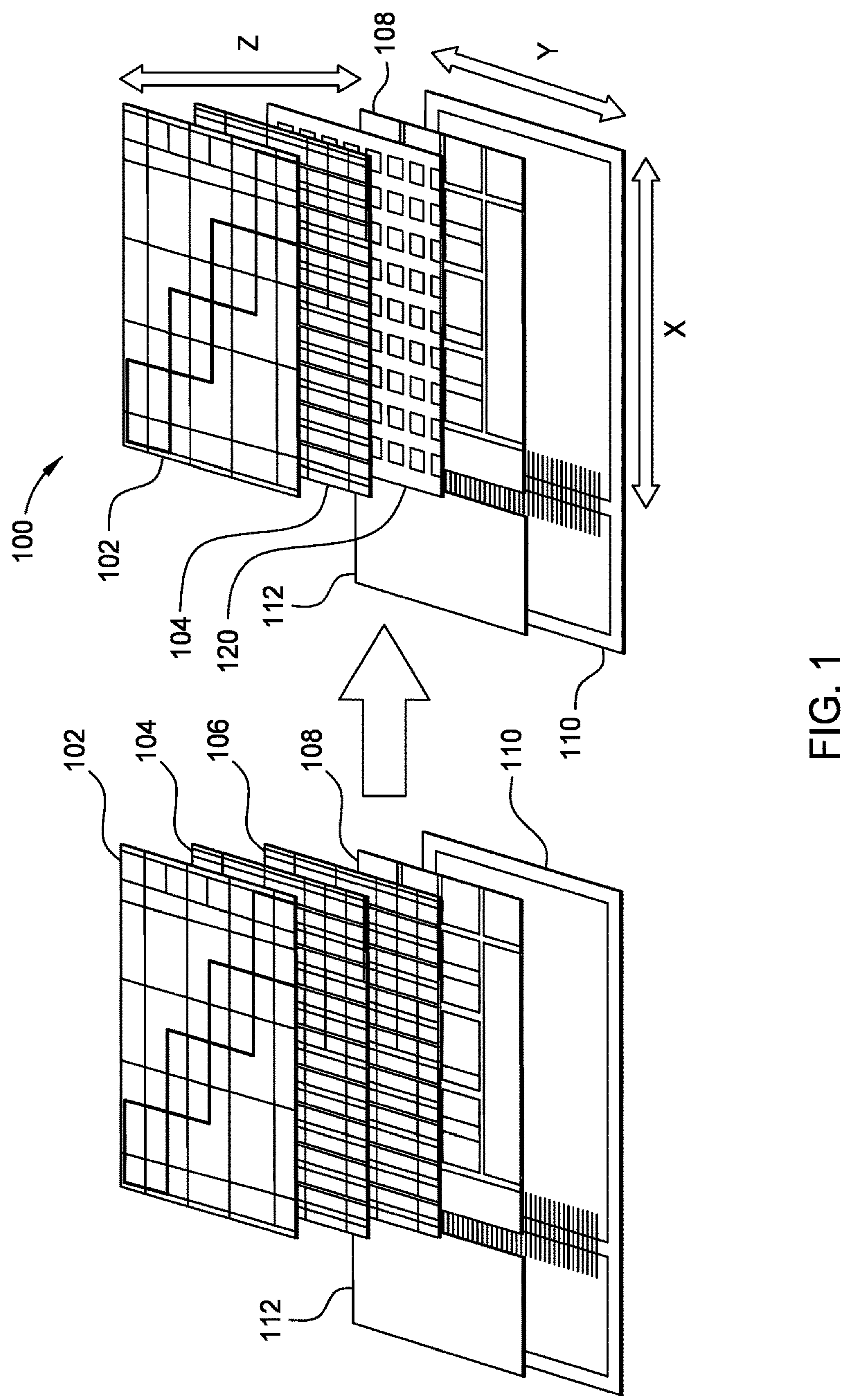
FIG. 1 illustrates a schematic isometric representation of an adaptive compute acceleration platform (ACAP) device configuration, according to one or more specific example embodiments of this disclosure.

Referring to FIG. 1, depicted is a schematic isometric representation of an adaptive compute acceleration platform (ACAP) device configuration, according to one or more specific example embodiments of this disclosure. A 3D-stacked device 100, as shown in FIG. 1, may comprise, for example but is not limited to, a four-depth stack comprising, one layer of CMOS logic 102, semiconductor fabric 106 replaced with a layer of silicon manufactured in a DRAM process, i.e., DRAM-capacitor fabric 120, a layer of input-output (I/O) 108, an interposer substrate 110, and high bandwidth memory (HBM) 112. The DRAM-capacitor fabric 120 may comprise a portion of trench capacitors 232 used for memory and the remainder for power network capacitance. It is contemplated and within the scope of this disclosure that the DRAM-capacitor fabric 120 comprises a silicon layer of trench capacitors 232 that may be used for both DRAM cells and PSN capacitors, are not limited to CMOS logic and could also benefit (enhance) the memory and power characteristics of other semiconductor devices formed in a 3D stack.

Hybrid Memory and Capacitance Implementation

In the simplest implementation, a 3D-stacked ACAP device 100 may be designed with one or more layers manufactured in a DRAM process, and a portion of the trench capacitors may be statically allocated to the power distribution network (PDN) by hard-wiring the trench capacitors used as voltage storage capacitor(s) to a power rail without the use of an interposing transistor.

Figure 2:
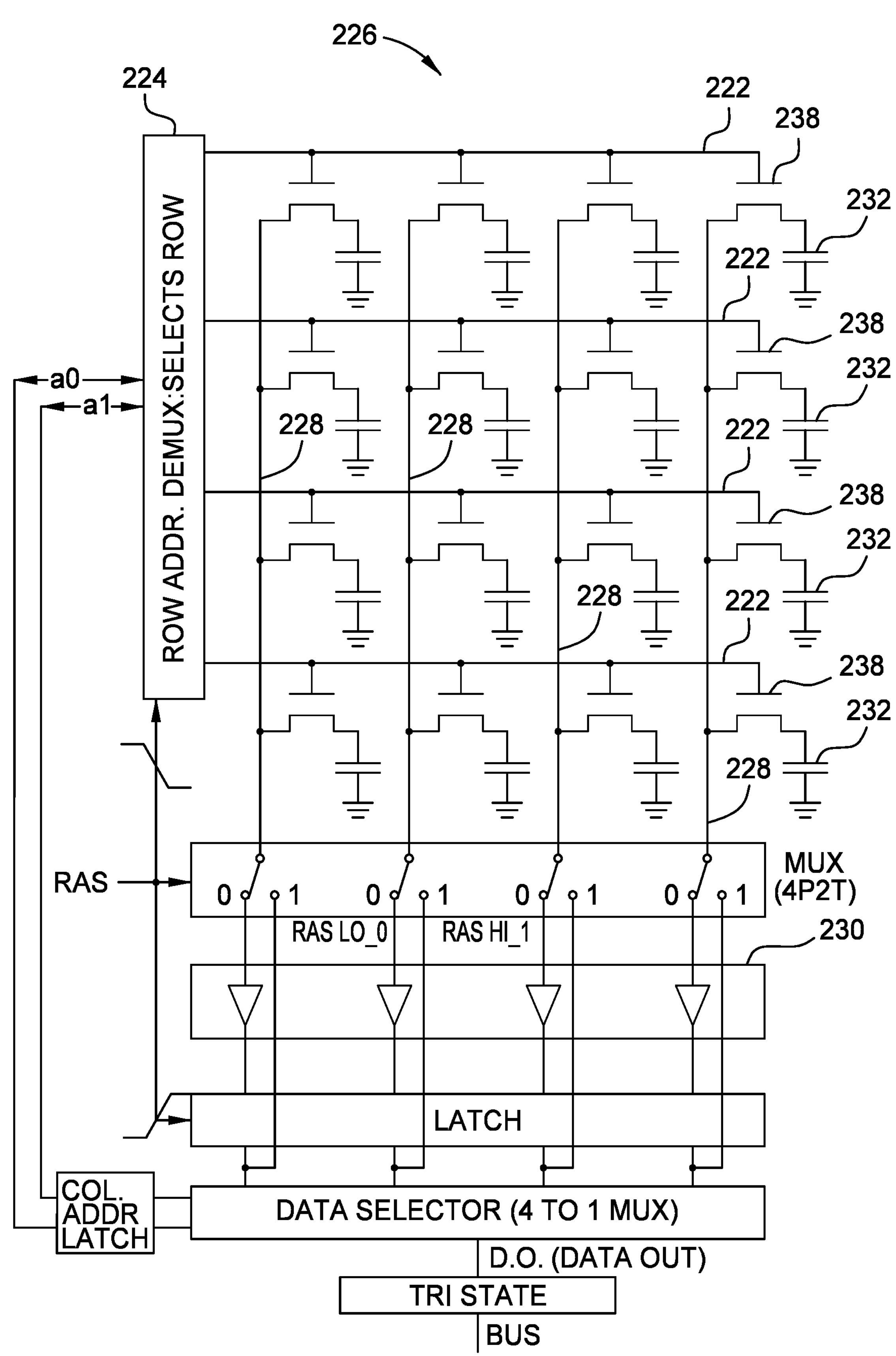
FIG. 2 illustrates a schematic diagram representation of a 16-bit DRAM bank in a 4 by 4 configuration, according to one or more specific example embodiments of this disclosure.

Referring to FIG. 2, depicted is a schematic diagram representation of a 16-bit DRAM bank in a 4 by 4 configuration, according to one or more specific example embodiments of this disclosure. A typical bank in modern DRAM products is much larger, e.g., 64 k by 8 k. Word lines 222 run horizontally from a selector circuit (row address demultiplexer 224) on one edge of a DRAM array 226 to select a word, and bit lines 228 routed vertically to sense amplifiers 230 on an adjacent edge to read the memory contents (data) stored in the trench capacitors 232.

Figure 3:
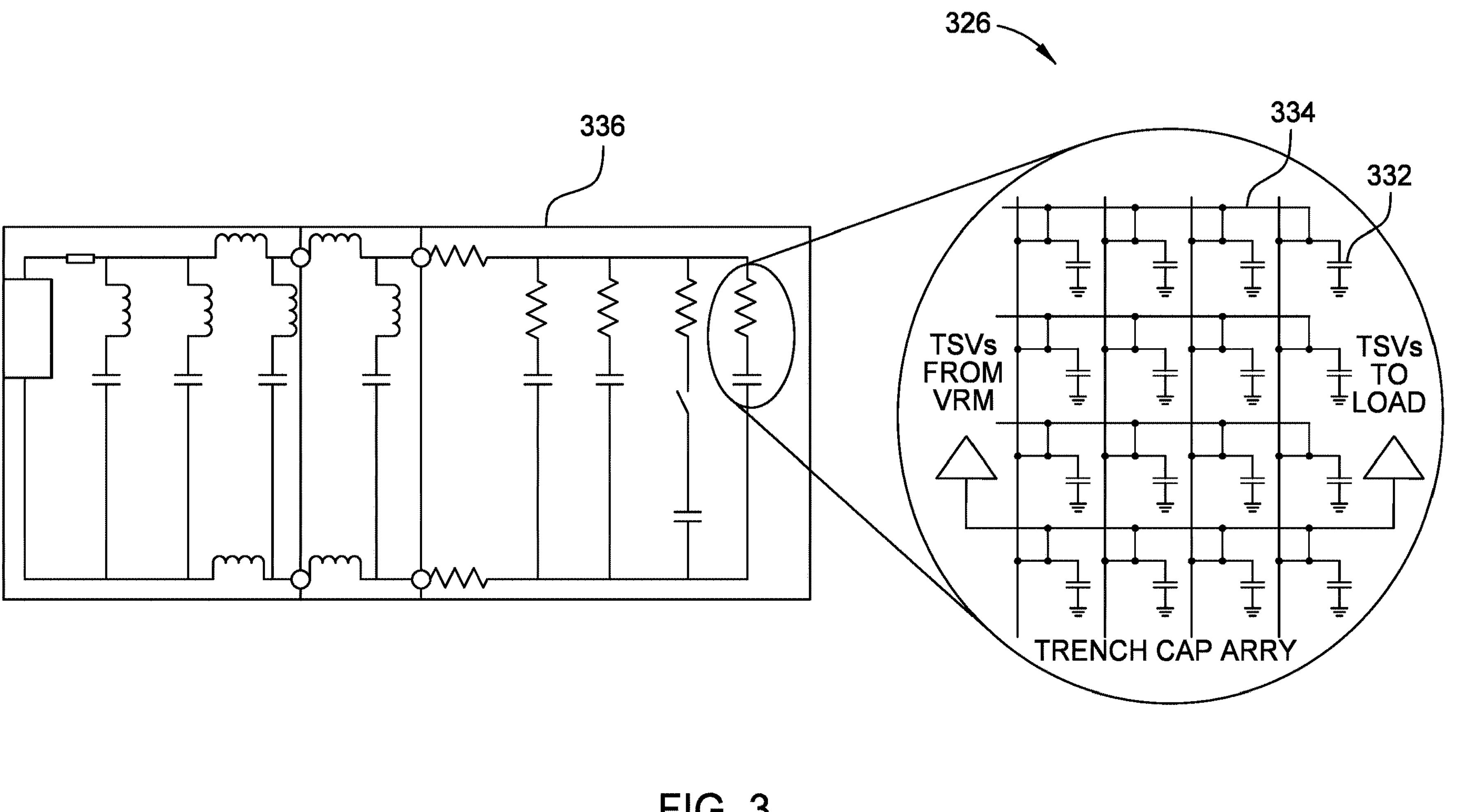
FIG. 3 illustrates a schematic diagram representation of a bank of trench capacitors connected directly to a power rail for adjacent logic, according to one or more specific example embodiments of this disclosure.

Referring to FIG. 3, depicted is a schematic diagram of a bank of trench capacitors connected directly to a power rail for adjacent logic, according to one or more specific example embodiments of this disclosure. In one embodiment, the trench capacitors 332 (trench capacitors 232) of an entire array of trench capacitors 326 may be connected directly to the power rails 334 for adjacent logic circuits without any transistors coupled to the array of trench capacitors 326. Such a coarse granularity capacitor design is the simplest, with perfect regularity of the array of trench capacitors 326. The power rails 334 may be coupled to a power distribution network (PDN) 336.

In another embodiment, a DRAM array 226 may have a portion of its trench capacitors 232 used for memory in a typical configuration, with some columns omitting the transistor 238 and instead wiring the trench capacitors 232 directly to a bit line 228 which is connected to power through silicon vias (TSVs). A finer granularity may be more attractive to lower wire resistance in the power delivery network (PDN) by delivering power directly through the Z-plane with less X/Y-dimensional jog.

In another embodiment, an array of trench capacitors 232 unrelated to a bank configuration may be added into or alongside one or more DRAM arrays 226. For example, trench capacitors 232 located near the precharge circuitry and/or sense amplifiers 230 typically need to drive larger transient currents and could benefit significantly from the additional decoupling capacitance from the nearby trench capacitors 332. This can improve timing margins and/or improve the reliability of the overall power distribution network (PDN).

Programmable Allocation of Capacitance/Memory

Figure 4:
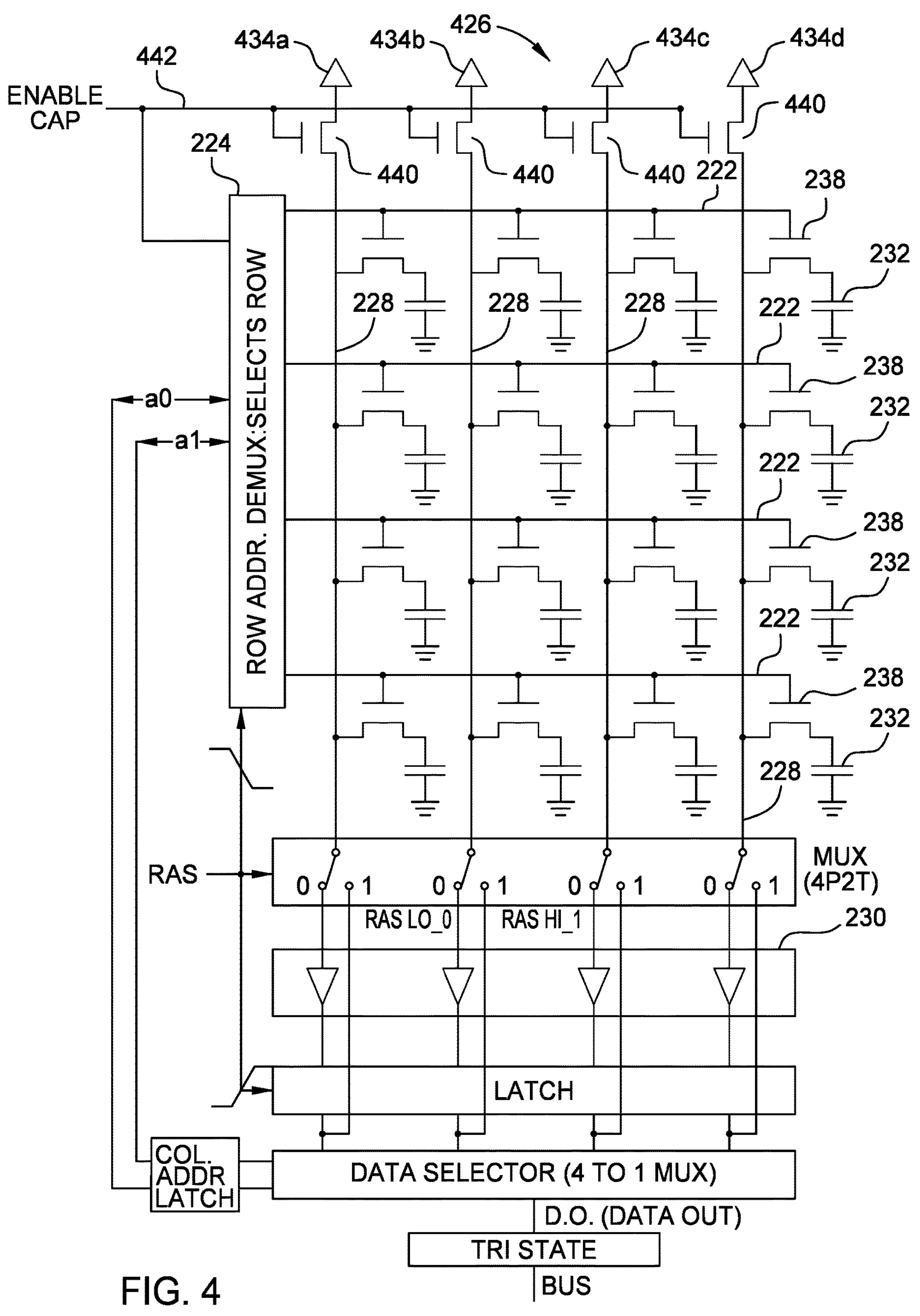
FIG. 4 illustrates a schematic diagram representation of a 16-bit DRAM bank in a 4 by 4 configuration having a capacitance enable circuit, according to one or more specific example embodiments of this disclosure.

Referring to FIG. 4, depicted is a schematic diagram representation of a 16-bit DRAM bank in a 4 by 4 configuration having a capacitance enable circuit, according to one or more specific example embodiments of this disclosure. At the penalty of increased resistance to reach the trench capacitors 232 by adding capacitance enable transistors 440 in series with the DRAM cell transistors 238, it is possible to add programmability such that a bank of DRAM memory (DRAM array 426) may be dynamically reconfigured to provide capacitance to the power delivery network (PDN). As shown in FIG. 4, each bit line 228 of the DRAM array 426 has a gated connection to a power rail 434, with a global signal (Cap Enable signal 442) enabling coupling between the bit lines 228 and power rails 434, as well as pulling all word lines 222 of the DRAM array 226 high, which couples the individual trench capacitors 232 to the bit lines 228. Thus, with the circuit shown in FIG. 4 the trench capacitors 232 of a defective DRAM array 426 may be connected to the power rails 434 by turning on the capacitance enable transistors 440 whereby those trench capacitors 232 are coupled to the PDN. Other trench capacitors 232 of a functional DRAM array 426*a* may be used as DRAM memory by turning off the capacitance enable transistors 440.

Defect Tolerance

As an extension of the circuit configuration described in FIG. 4, the recovery of useful silicon may be maximized by adding a defect tolerance mechanism which reassigns a bank of the DRAM array 426 to the capacitive network coupled to the PDN as a result of individual cells, sense amplifiers, and/or row controllers failing to function to design. In conventional DRAM products, defects lead to "wasted" silicon which may exceed the cost of programmability to reconfigure cells not suitable for use as memory to the PDN. The trench capacitors 232 of FIG. 4 may be "repurposed" if it's associated support electronic circuits proves to be partially defective or inoperable for its intended purpose as a functional DRAM array 426.

In embodiments utilizing a 3D stack having a plurality of DRAM arrays 426 on a semiconductor die, i.e., DRAM-capacitor fabric 120, multiple identical dice can be stacked together, but then an individual die can be configured/allocated to function as either a traditional DRAM or as a decoupling capacitance layer. This avoids having to tape out two different dice, and this could also provide a means of harvesting dice with insufficient functionality to perform as an operational DRAM. As an example, a nine-high stack of DRAM dice (DRAM-capacitor fabric 120) could be fabricated, where one layer can serve as a decoupling capacitance layer for the entire DRAM stack. After manufacturing, especially with wafer-on-wafer (WoW) bonding, where known-good die testing cannot practically be used to match good die with good die), individual stacks can be tested to determine which (if any) layers or sub-regions of layers are defective from a DRAM functionality perspective. If at most one layer or sub-region of a layer is defective for DRAM operation but can be utilized as decoupling capacitance, then that layer or sub-region may be configured thusly, leaving the remaining eight fully-functional DRAM layers to provide the desired DRAM functions. (If no layers or sub-region of a layer are defective, then one layer can be arbitrarily selected to provide the decoupling capacitance needed.)

Dynamic Assignment of DRAM and Capacitor Arrays

Figure 5:
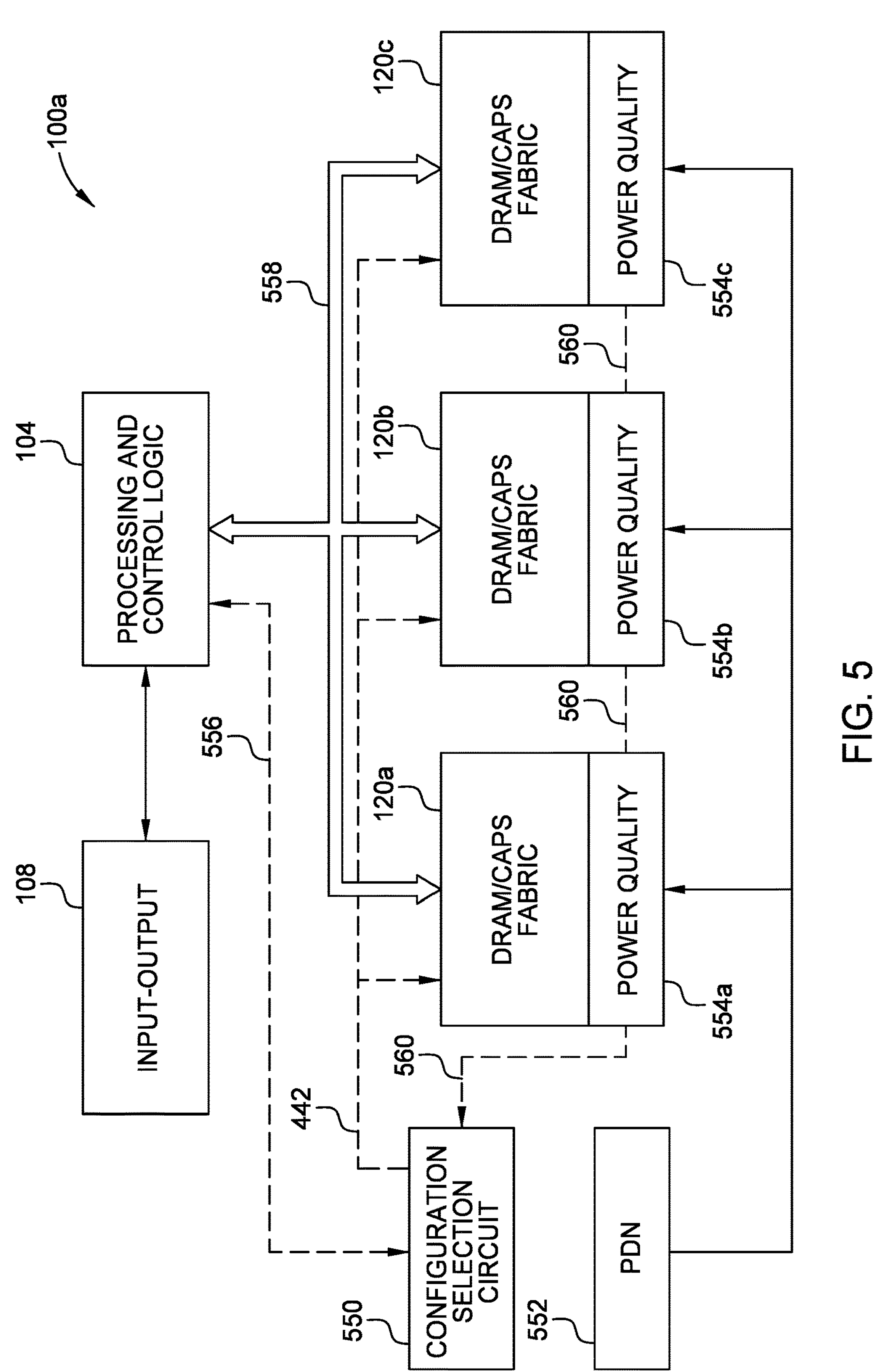
FIG. 5 illustrates a schematic block diagram of an ACAP device having dynamic assignment of DRAM and capacitor arrays, according to one or more specific example embodiments of this disclosure.

Referring to FIG. 5, depicted is a schematic block diagram of an ACAP device having dynamic assignment of DRAM and capacitor arrays, according to one or more specific example embodiments of this disclosure. An ACAP device 100*a* may comprise a plurality of stacked integrated circuit dice in a WoW configuration. The WOW configuration may include an input-output die 108, processing and control logic die 104, a plurality of DRAM/capacitor dice 120, a configuration selection circuit 550, a power distribution network (PDN) 552 and power quality monitoring and control 554 associated with each DRAM/capacitor die 120. The power quality monitoring and control 554 is adapted to detect when certain DRAM arrays should be dynamically reassigned to capacitor arrays when more capacitance needs to be coupled to the PDN 552. The power quality monitoring and control 554 detects when there is a power voltage drop or when a large data transfer occurs so as to improve data transfer noise immunity and data integrity during a current surge that may cause a power supply voltage drop. The power quality monitoring and control 554 may communicate with the configuration selection circuit 550 over communications line 560 to relay detection of a power supply problem and the location(s) thereof.

The configurations of which DRAM arrays 226 will be used for DRAM operation and which will be used as supplemental PDN capacitance may also be programmed to occur before a power intensive event occurs and/or when a defective DRAM array is known and can only be used as supplemental PDN capacitance. The configuration selection circuit 550 may select which of the DRAM arrays 226 will be used for DRAM operation and which other DRAM arrays 226 will be used as supplemental PDN capacitance over the control line 442. The configuration selection circuit 550 may also be in communications with the processing and control logic die 104 over communications bus 556 for receiving instructions as to which DRAM arrays 226 will be needed as supplemental PDN capacitance (dynamic selection programming). The configuration selection circuit 550 may also communicate with the processing and control logic die 104 to notify which DRAM arrays 226 may only be used for supplemental PDN capacitance.

The allocation of DRAM elements for use as PDN capacitance may be dynamically assigned based on overall system power supply performance requirements. Power supply monitors, e.g., power quality monitoring and control 554 may be included at various locations in the CMOS layers and device packaging to determine the power supply quality at those locations. Those power quality monitoring and control 554 may be adapted to detect when the quality of the power supply is nearing an invalid condition threshold trigger, indicating the need for additional capacitance coupled to the PDN. Once triggered, several approaches may be used to dynamically transition memory elements. In a hardware managed cache-like scenario, memory elements could be invalidated and kept in that state. Alternatively, in a software managed scenario where a memory manager (instructing the configuration selection circuit 550) is allocating the memory, contents of those memory elements could be migrated and then marked as not used. In either of those control scenarios or in others, the memory storage elements (trench capacitors 232) used as capacitance could be reclaimed when the power quality monitoring and control 554 indicates when a threshold to valid operating conditions are met.

While the foregoing is directed to embodiments of the present invention, other and further embodiments of the invention may be devised without departing from the basic scope thereof, and the scope thereof is determined by the claims that follow.

What is claimed is:

1. An integrated circuit (IC) stack, comprising:

a plurality of semiconductor IC dice stacked together and having circuit interconnections therebetween; and at least one of the plurality of semiconductor IC dice comprises a plurality of dynamic random-access memory (DRAM) arrays, wherein each of the plurality of DRAM arrays comprises a plurality of trench capacitors and support circuits therefor, wherein first trench capacitors of the plurality of trench capacitors of a first DRAM array of the plurality of DRAM arrays are adapted for coupling to a power bus rail, and second trench capacitors of the plurality of trench capacitors of the first DRAM array are adapted for memory use, and wherein a configuration selection circuit selects the second trench capacitors to be used for memory and the first trench capacitors to be coupled to the power bus.

2. The IC stack of claim 1, wherein the power bus is adapted for coupling to a power distribution network (PDN) of at least one of the plurality of semiconductor IC dice.

3. The IC stack of claim 1, wherein the first trench capacitors are adapted for coupling directly to the power bus.

4. The IC stack of claim 1, wherein the first trench capacitors are adapted for coupling to the power bus through the support circuits.

5. The IC stack of claim 1, wherein the first trench capacitors are adapted for coupling to a plurality of power buses.

6. The IC stack of claim 1, wherein the plurality of trench capacitors of a second DRAM array of the plurality of DRAM arrays are available for use as memory.

7. The IC stack of claim 1, wherein the configuration selection circuit selects, upon an increase in logic activity or current draw, which ones of the plurality of DRAM arrays have trench capacitors coupled to the power bus.

8. The IC stack of claim 1, wherein the configuration selection circuit dynamically allocates which ones of the plurality of DRAM arrays are used for memory and which other ones of the plurality of DRAM arrays have trench capacitors thereof coupled to the power bus.

9. The IC stack of claim 8, wherein the trench capacitors are selected for coupling to the power bus when power quality monitoring circuits detect a low power voltage or fault at an associated DRAM array thereof.

10. A method for coupling capacitance to a power distribution network (PDN) in an integrated circuit (IC) stack, comprising:

selecting via a configuration selection circuit, first trench capacitors of a plurality of trench capacitors of a first dynamic random-access memory (DRAM) array to be coupled to a power bus wherein each of the plurality of DRAM arrays comprises a plurality of trench capacitors and support circuits therefor, and wherein the plurality of DRAM arrays are within at least one of a plurality of semiconductor IC dice that are stacked together and have circuit interconnections therebetween; and selecting, via the configuration selection circuit, second trench capacitors of the plurality of trench capacitors of the first DRAM array to be used for memory, wherein the power bus is adapted for coupling to the PDN.

11. The method of claim 10 further comprising for detecting, via power quality monitoring circuits, a low power voltage or fault at an associated DRAM array.

12. The method of claim 11, further comprising assigning DRAM arrays for either use for memory or for coupling trench capacitors, associated with DRAM arrays not selected for use as memory, to the power bus based on detecting the low power voltage or fault.

13. The method of claim 10, wherein the configuration selection circuit dynamically assigns which ones of the plurality of DRAM arrays are used for memory and which other ones of the plurality of DRAM arrays, not used for memory, have trench capacitors thereof coupled to the power bus.

14. The method of claim 13, storing, via the configuration selection circuit, the assignments of which of the ones of the plurality of DRAM arrays are used for memory and which of the trench capacitors, associated with the other ones of the plurality of DRAM arrays not used for memory, are coupled to the power bus.

15. A system of integrated circuit (IC) dice arranged in a three-dimensional stacked configuration, comprising:

an interposer base adapted for connecting to external circuits;

a logic circuit IC die electrically coupled to the interposer base;

at least one memory IC die comprising a plurality of dynamic random-access memory (DRAM) arrays, each of the plurality of DRAM arrays comprising a plurality of trench capacitors and support circuits therefor; and at least one digital logic and processing IC die, wherein first trench capacitors of the plurality of trench capacitors of a first DRAM array of the plurality of DRAM arrays are dynamically allocated to be used for memory and second trench capacitors of the plurality of trench capacitors of the first DRAM array are dynamically allocated to be coupled to a power bus, the power bus is adapted for coupling to a power distribution network (PDN) for supplying power to the IC dice.

16. The system of claim 15, wherein a configuration selection circuit is programmed to select a first one or more of the plurality of DRAM arrays to be used for memory and a second one or more of the plurality of DRAM arrays have trench capacitors thereof coupled to the power bus and are not used for memory.

17. The system of claim 15, wherein signals and power are coupled between the stacked ICs with through silicon vias (TSV).

* * * * *